(12) United States Patent
Min

(10) Patent No.: US 11,848,306 B2
(45) Date of Patent: Dec. 19, 2023

(54) TILED IMAGE SENSOR

(71) Applicant: ArcSoft Corporation Limited, Hangzhou Zhejiang (CN)

(72) Inventor: Byung Il Min, Hangzhou (CN)

(73) Assignee: ArcSoft Corporation Limited, Hangzhou (CN)

(*) Notice: Subject to any disclaimer, the term of this patent is extended or adjusted under 35 U.S.C. 154(b) by 255 days.

(21) Appl. No.: 17/441,976

(22) PCT Filed: Mar. 19, 2020

(86) PCT No.: PCT/IB2020/020015
§ 371 (c)(1),
(2) Date: Sep. 22, 2021

(87) PCT Pub. No.: WO2020/194069
PCT Pub. Date: Oct. 1, 2020

(65) Prior Publication Data
US 2022/0199576 A1    Jun. 23, 2022

(30) Foreign Application Priority Data

Mar. 22, 2019  (KR) .................. 10-2019-0033081

(51) Int. Cl.
*H01L 25/065* (2023.01)
*G02B 3/00* (2006.01)
(Continued)

(52) U.S. Cl.
CPC ........ *H01L 25/0655* (2013.01); *G02B 3/0056* (2013.01); *G02B 5/005* (2013.01);
(Continued)

(58) Field of Classification Search
CPC ........... H01L 25/0655; H01L 27/14636; H01L 27/14627; H01L 27/146; H01L 27/14623;
(Continued)

(56) References Cited

U.S. PATENT DOCUMENTS 8,610,155 B2 * 12/2013 Hatano .................. H10K 71/50
313/506
9,599,723 B2 * 3/2017 Jadrich .................. G01T 1/2006
(Continued)

FOREIGN PATENT DOCUMENTS

CN      105679782 A    6/2016
CN      108291972 A    7/2018
(Continued)

OTHER PUBLICATIONS

International Search Report issued in International Application No. PCT/IB2020/020015 dated Sep. 2, 2020 (5 pages).
Written Opinion issued in International Application No. PCT/IB2020/020015 dated Sep. 2, 2020 (6 pages).

*Primary Examiner* — Pritham D Prabhakher
(74) *Attorney, Agent, or Firm* — Osha Bergman Watanabe & Burton LLP

(57) ABSTRACT

The present invention relates to a tiled image sensor. The tiled image sensor includes: a substrate on which conductive wiring is formed; and a plurality of image sensor dies arranged on the substrate to be spaced apart from each other by a first distance and electrically connected to the conductive wiring. The image sensor die includes: a plurality of light receiving sub-regions formed to be spaced apart from each other by a second distance; a peripheral circuit that is formed between the plurality of light receiving sub-regions, converts pixel current generated for each pixel included in the plurality of light receiving sub-regions into image data, and outputs the image data in block units; and a contact pad, the contact pad formed on a surface of the image sensor die to electrically connect the image sensor die to the substrate.

12 Claims, 11 Drawing Sheets

(51) Int. Cl.
  *G02B 5/00* (2006.01)
  *H01L 27/146* (2006.01)
  *H04N 25/40* (2023.01)
  *H04N 25/75* (2023.01)
  *G06V 40/13* (2022.01)
  *H01L 23/538* (2006.01)
(52) U.S. Cl.
  CPC .. *H01L 27/14623* (2013.01); *H01L 27/14627* (2013.01); *H01L 27/14636* (2013.01); *H04N 25/40* (2023.01); *H04N 25/75* (2023.01); *G06V 40/1318* (2022.01); *H01L 23/538* (2013.01); *H01L 27/14605* (2013.01)
(58) Field of Classification Search
  CPC ............ H01L 27/14605; H01L 23/538; G02B 3/0062; G02B 3/0056; G02B 5/005; G02B 5/003; H04N 25/75; H04N 25/40; G06V 40/1318
  USPC ........................................................ 348/302
  See application file for complete search history.

(56) References Cited

U.S. PATENT DOCUMENTS

| | | | |
|---|---|---|---|
| 9,846,246 B2* | 12/2017 | Jadrich | ................... G01T 1/243 |
| 10,284,824 B2* | 5/2019 | Cai | ................... H01L 27/14643 |
| 11,329,090 B2* | 5/2022 | Takachi | ............ H01L 27/14625 |
| 2016/0179453 A1* | 6/2016 | Jepsen | .................. G06F 3/1446 |
| | | | 345/1.3 |
| 2017/0052263 A1* | 2/2017 | Jadrich | ................ H01L 27/1469 |
| 2017/0083745 A1* | 3/2017 | Goodelle | ........... G06V 40/1329 |
| 2017/0153334 A1* | 6/2017 | Jadrich | ................... H01L 22/12 |
| 2018/0227549 A1* | 8/2018 | Cai | ................... H01L 27/14636 |
| 2019/0019831 A1* | 1/2019 | Takachi | ............ H01L 27/14685 |
| 2020/0145597 A1* | 5/2020 | Prathipati | .............. H04N 25/74 |

FOREIGN PATENT DOCUMENTS

| | | |
|---|---|---|
| CN | 109376714 A | 2/2019 |
| CN | 109496313 A | 3/2019 |
| JP | 2002214351 A | 7/2002 |

\* cited by examiner

TILED IMAGE SENSOR

FIELD OF THE INVENTION

The present invention relates to image sensors.

BACKGROUND OF THE INVENTION

An image sensor is a device that detects light reflected onto a photographed object and outputs an image represented as an electrical signal. An image sensor is composed of a plurality of pixels that generate electrical signals corresponding to an amount of light detected. A size of the image sensor is mainly determined by a number of the pixels. When an area occupied by the pixels on a surface of the image sensor is increased by, for example, increasing the number of the pixels or an area of a light receiving portion, regions that the image sensor can detect are also increased. However, a size of a silicon wafer required for manufacturing the image sensor is limited, which accounts for a considerable part of the manufacturing cost of the image sensor.

There is always a demand for an image sensor with a large-area detection region. An X-ray camera is a representative device that requires an image sensor with a large-area detection region. In order to expand the detection region or enhance resolution, structures in which a plurality of image sensors are arranged have been proposed. Image sensors suitable for these structures are packaged common image sensors. When the object for the application is a large device (for example, an X-ray camera, a TV camera, and the like), the physical size of a packaged common image sensor array becomes a big problem.

SUMMARY OF THE INVENTION

Problem to be Solved by the Present Invention

The present invention provides an image sensor which has a large-area detection region and can also be installed in a portable electronic device.

Means for Solving the Problem

According to an aspect of the present invention, a tiled image sensor with a large-area detection region is provided. The tiled image sensor includes: a substrate on which conductive wiring is formed; and a plurality of image sensor dies arranged to be spaced apart from each other by a first distance and electrically connected to the conductive wiring. The image sensor die includes: a plurality of light receiving sub-regions formed to be spaced apart from each other by a second distance; a peripheral circuit that is formed between the plurality of light receiving sub-regions, converts pixel current generated for each pixel included in the plurality of light receiving sub-regions into image data, and outputs the image data in block units; and a contact pad formed on a surface of the image sensor die to electrically connect the image sensor die to the substrate.

As one embodiment, the plurality of light receiving sub-regions are respectively arranged at corners of a light incident surface of the image sensor die, and the first distance and the second distance are the same.

As one embodiment, the plurality of light receiving sub-regions are N*M pixel arrays.

As one embodiment, the tiled image sensor further includes an optical lens layer arranged above the plurality of image sensor dies with light paths formed at positions corresponding to the plurality of light receiving sub-regions. Lower surfaces of the plurality of image sensor dies opposite to the light incident surfaces are bonded to the substrate, and the conductive wiring is formed on an upper surface of the substrate.

As one embodiment, the optical lens layer is formed by an optically opaque material, and the light paths are pinholes extending from an upper surface to a lower surface of the optical lens layer.

As one embodiment, the optical lens layer includes: an optically transparent light path layer; a light shielding layer arranged above the light path layer with openings formed at positions corresponding to the light receiving sub-regions; and upper lenses formed in the openings. The light paths are defined by the openings and the upper lenses.

As one embodiment, the optical lens layer includes: an optically transparent light path layer; a light shielding layer above the light path layer with openings formed at positions corresponding to the light receiving sub-regions; upper lenses formed in the openings; and lower lenses formed corresponding to the upper lenses.

As one embodiment, the substrate includes light paths formed at positions corresponding to the plurality of light receiving sub-regions, the light incident surfaces of the plurality of image sensor dies are bonded to the substrate, and the conductive wiring is formed on a lower surface of the substrate.

As one embodiment, the peripheral circuit includes: a readout circuit that converts the pixel current generated for each pixel included in the plurality of light receiving sub-regions into the image data; and a data output circuit that outputs the image data in block units in sequence through a data line formed by the conductive wiring.

As one embodiment, the peripheral circuit further includes a row driver that selects pixels for outputting the pixel current from the plurality of light receiving sub-regions.

As one embodiment, a part or all of the plurality of image sensor dies share the data line.

As one embodiment, the plurality of image sensor dies are operated by a control signal applied through a control line formed by the conductive wiring.

Invention Effects

Compared with conventional image sensors, the image sensor of the embodiments of the present invention has a large-area detection region at a relatively low cost. In particular, it can have a physical size that allows installation in a portable electronic device.

BRIEF DESCRIPTION OF THE DRAWINGS

Hereinafter, the present invention will be described with reference to illustrated embodiments. In order to help the understanding of the present invention, the same constituent elements are given the same symbols throughout the drawings. The structures illustrated in the drawings are exemplary embodiments described in order to explain the present invention, but the scope of the present invention is not limited thereto. In particular, in the drawings, in order to help the understanding of the present disclosure, some constituent elements are shown to be somewhat enlarged. The drawings are means used for understanding the present invention and, therefore, the widths or thicknesses or the like of the constituent elements shown in the drawings may be different in actual implementation.

DETAILED DESCRIPTION OF THE EMBODIMENTS

Figure 1:
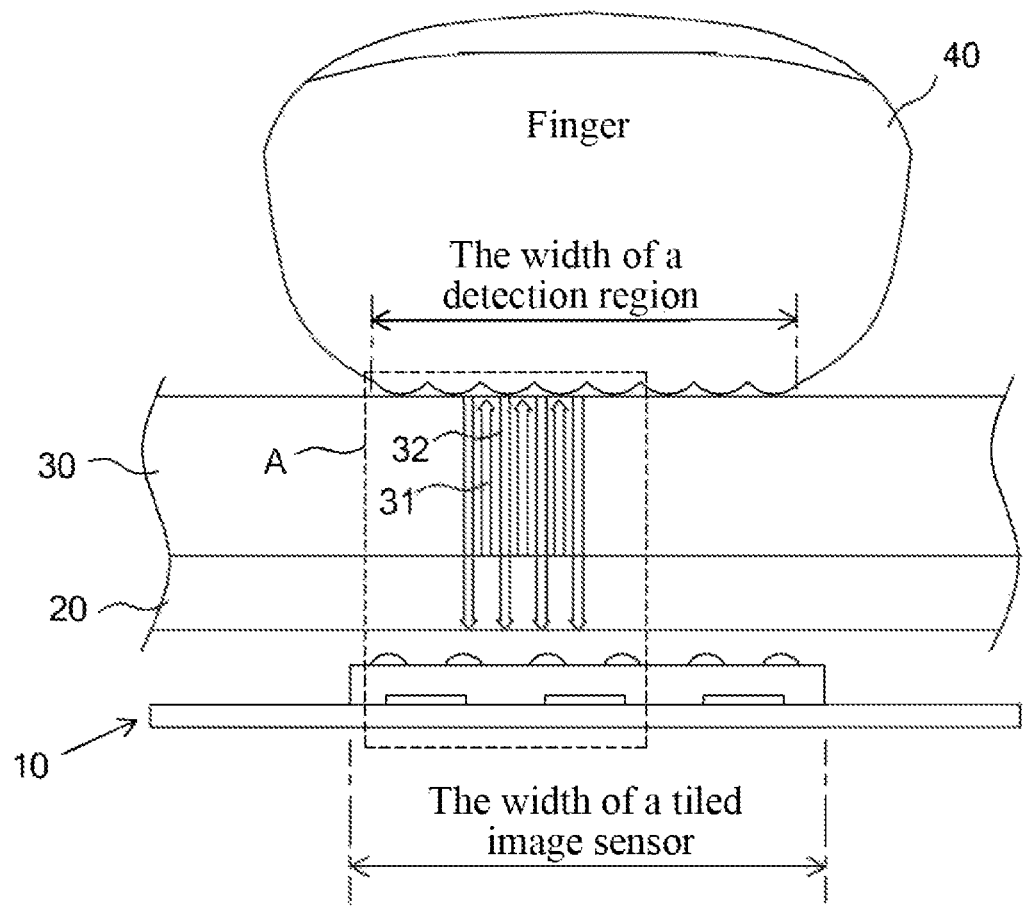
FIG. 1 is a diagram schematically showing an action principle of a tiled image sensor using panel light.

Various modifications can be made to the present invention, which can have various embodiments. Here, specific embodiments are illustrated in the drawings and described in detail via the detailed description. However, the present invention is not limited to specific embodiments, but can include all modifications, equivalents, and even substitutes within the concept and technical scope of the present invention. In particular, functions, features, and embodiments described below with reference to the drawings can be implemented individually or in combination with another embodiment. Therefore, the scope of the present invention is not limited to the forms shown in the attached drawings.

On the other hand, expressions such as "substantially," "almost," "about," and the like in the terms used in this specification are expressions in consideration of a margin applicable in actual implementation or an error that may occur. For example, "substantially 90 degrees" can be interpreted as including an angle at which the same effect as the effect at 90 degrees can be expected. As another example, "almost non-existent" means that even if traces exist, they are negligible.

On the other hand, when not specifically mentioned, "side" or "horizontal" is used for indicating a left-right direction of the figure, and "vertical" is used for indicating an up-down direction of the figure. In addition, unless specifically defined, an angle, an incident angle, and the like are based on an imaginary straight line perpendicular to a horizontal plane shown in the figure.

In all the drawings, the same or similar elements are represented by the same symbols.

FIG. 1 is a diagram schematically showing an action principle of a tiled image sensor using panel light.

A tiled image sensor 10 is disposed below a display panel 20. An electronic device includes the display panel 20 and cover glass 30 disposed above the display panel 20 to protect the display panel 20. The tiled image sensor 10 is configured corresponding to a part or all of regions of a lower portion of the display panel 20. The tiled image sensor 10 detects panel light 32 that is reflected at an upper surface of the cover glass 30 so as to travel toward the display panel 20 among the light (31; hereinafter referred to as panel light) generated by the display panel 20. The display panel 20 generates the panel light 31 that is irradiated toward a photographed object 40 by turning on a combination of R, G, and B pixels. Here, the panel light 31 is visible light. For example, the panel light 31 is visible light belonging to a specific waveband, a green or blue waveband.

The tiled image sensor 10 detects the photographed object 40 in contact with the upper surface of the cover glass 30. The photographed object 40 is, for example, a finger, a stylus pen, or the like in contact with the upper surface of the cover glass 30. As one embodiment, when the photographed object 40 is a finger, the tiled image sensor 10 generates a fingerprint image of a region in contact with the upper surface of the cover glass 30. Among the panel light 31 generated by the display panel 20, at least a part of the light travels toward the cover glass 30. When ridges of the fingerprint are in contact with the cover glass 30, a part of the panel light 31 that reaches contact points of the cover glass and the ridges is absorbed by the ridges. Conversely, the panel light 31 reaching locations corresponding to valleys of the fingerprint is reflected toward the display panel 20. Here, the reflected panel light 32 reaches the tiled image sensor 10 through the display panel 20. The panel light 32 reflected at various angles reaches the tiled image sensor 10 at various angles. The tiled image sensor 10 generates the fingerprint image by using the reflected panel light 32 passing through the display panel 20 from among the panel light 32 reflected at various angles. The panel light 32 reflected at the locations corresponding to the valleys of the fingerprint is relatively bright, and the panel light 32 reflected at the locations corresponding to the ridges of the fingerprint is relatively dim. Therefore, the fingerprint image generated by the tiled image sensor 10 has a form in which a relatively dark pattern corresponding to the ridges of the fingerprint is displayed on a bright background in general. As another embodiment, when the photographed object 40 is a finger or a stylus pen, the tiled image sensor 10 detects the position in contact with the cover glass 30. A light receiving sub-region (110a, 110b, 110c and 110d in FIG. 2) of the tiled image sensor 10 is composed of a plurality of pixels, and each pixel generates pixel current corresponding to an amount of incident light. The resolution of the tiled image sensor 10 is determined by the pixel arrays arranged in the light receiving sub-regions and a distance between the light receiving sub-regions, and an area of a detection region on the upper surface of the cover glass 30 is approximately determined by the resolution of the tiled image sensor 10 and a distance between the cover glass and the tiled image sensor.

The tiled image sensor 10 includes a plurality of light receiving sub-regions respectively corresponding to a plurality of detection sub-regions that constitute the large-area detection region. When an optical system composed of a plurality of lenses is used, an area of a detection region corresponding to a single image sensor is expanded to nearly infinity. However, it is difficult to dispose such an optical system at a position where a distance to the photographed object is only several hundred to several thousand micrometers, for example, below the display panel 20. When an optical fingerprint sensor is disposed below the display panel 20, since the distance between the light receiving region and the detection region of the image sensor is short, it is difficult to ensure a large-area detection region. In order to ensure a structure with sufficient space below the display panel 20, an optical lens is arranged between the image sensor and the display panel to expand the detection region, but light incident from the peripheral portion of the optical lens would result in a distorted image. In the tiled image sensor 10, one light receiving sub-region and one detection sub-region are arranged in a 1:1 correspondence. Therefore, it is possible to minimize the possibility of image distortion while ensuring a large-area detection region. Image distortion may occur when the large-area detection region is realized by providing a packaged common image sensor. In order to solve this problem, many technical researches and developments have been carried out. The tiled image sensor 10 can also realize the large-area detection region without greatly increasing the manufacturing cost of the image sensor, and the size of the wafer used for manufacturing the image sensor is not limited. In particular, when compared with a packaged common image sensor array, the thickness of the image sensor can be significantly reduced, allowing the sensor to be placed below the display panel 20.

Figure 2:
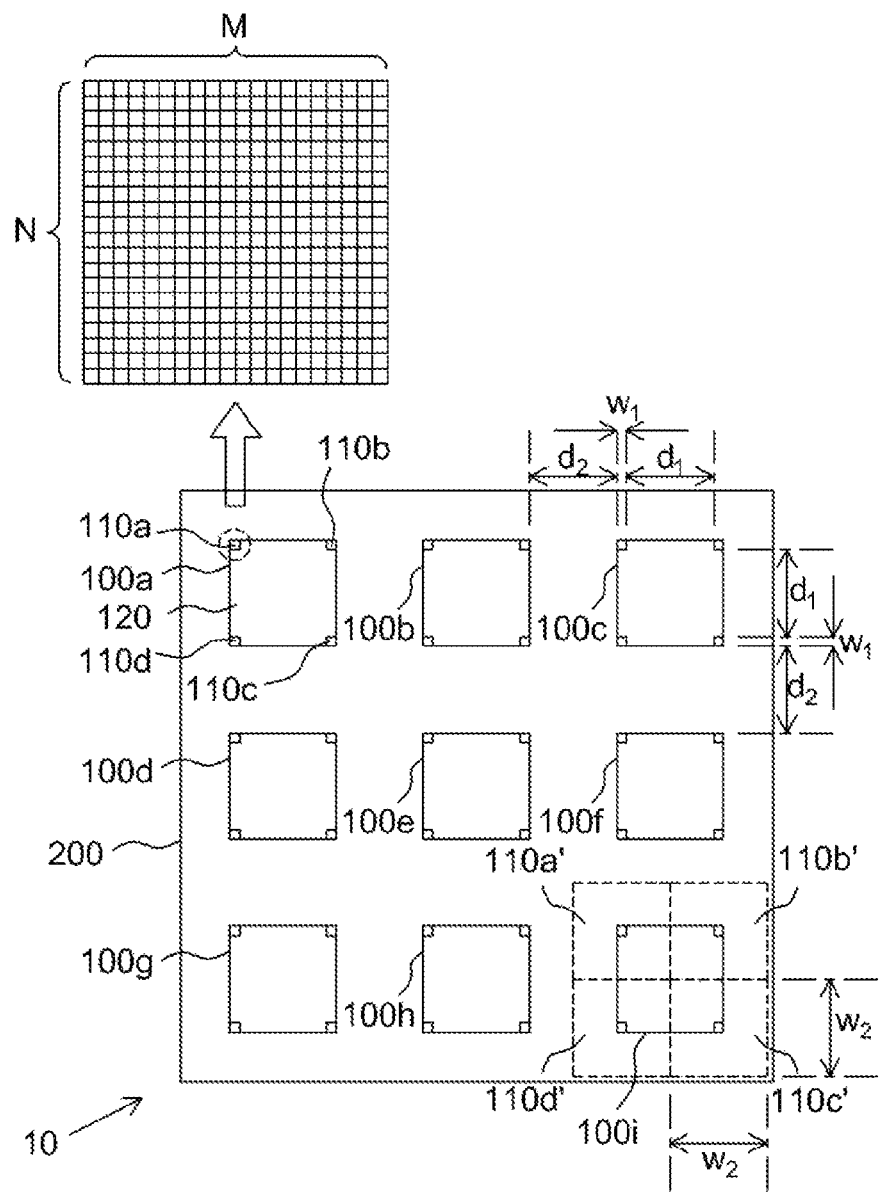
FIG. 2 is a diagram schematically showing a tiled image sensor.

FIG. 2 is a diagram schematically showing the tiled image sensor.

The tiled image sensor 10 includes a plurality of image sensor dies (100a to 100i; collectively referred to as 100 hereinafter), and a substrate 200 electrically connected to the plurality of image sensor dies 100. The image sensor die 100 includes a plurality of separate light receiving sub-regions (110a, 110b, 110c, 110d; collectively referred to as 110 hereinafter), and a peripheral circuit 120 formed in a region that is not occupied by the light receiving sub-regions 110a, 110b, 110c and 110d. Here, the image sensor dies 100 are bonded to the substrate 200 in an unpackaged state.

The plurality of light receiving sub-regions 110a, 110b, 110c and 110d are each an N*M (N and M may be the same) pixel array formed by arranging a plurality of pixels. The pixel is composed of, for example, a light receiving portion that receives reflected panel light 32 and a plurality of transistors that output pixel current corresponding to a quantity of charge accumulated in the light receiving portion. The resolution of the tiled image sensor 10 is substantially the same as a number of the pixels formed in the plurality of light receiving sub-regions 110 of the plurality of image sensors 100.

The plurality of light receiving sub-regions (110a to 110d) are formed on the image sensor die 100 to be spaced apart from each other by substantially the same distance $d_1$. The plurality of light receiving sub-regions (110a to 110d) are configured in a bilateral symmetry and a longitudinal symmetry, respectively, with respect to an imaginary vertical line and an imaginary horizontal line which pass through a center of the image sensor die 100. As one embodiment, the plurality of light receiving sub-regions (110a to 110d) are arranged to be spaced apart to the greatest extent from a center of a light incident surface (i.e., an upper surface or a lower surface) of the image sensor die 100. For example, the plurality of light receiving sub-regions (110a to 110d) are respectively formed at corners of the light incident surface. When the plurality of light receiving sub-regions (110a to 110d) are arranged at the corners, a separation distance $d_2$ between the image sensor dies 100 is substantially the same as the distance $d_1$. As a result, a number of the image sensor dies required to ensure a large-area detection region is reduced. A plurality of detection sub-regions (110a' to 110d') respectively corresponding to the plurality of light receiving sub-regions (110a to 110d) are formed so as not to generate overlapping regions or form minimum overlapping regions. The horizontal and longitudinal lengths $w_2$ of the plurality of detection sub-regions (110a' to 110d') are determined according to a combination of a power of a micro-optical structure disposed between the light receiving sub-region and the detection sub-region and a distance between the light receiving sub-region and the detection sub-region. For example, a ratio of the horizontal length $w_1$ of the first light receiving sub-region 110a to the horizontal length $w_2$ of the first detection sub-region 110a' is 1:10. When the distance $d_1$ between the plurality of light receiving sub-regions (110a to 110d) is shorter than that in the configuration example shown in FIG. 2, the overlapping regions between the plurality of detection sub-regions (110a' to 110d') are increased, and the area of the actual detection region is reduced. When the distance $d_2$ between the other image sensor dies arranged on the periphery is reduced to compensate for the reduction in the area, in order to ensure a large-area detection region with the same area, the number of the image sensor dies required can be increased.

The peripheral circuit 120 is formed in a remaining region where the plurality of sub-light receiving regions 110 are not formed. As one embodiment, the peripheral circuit 120 includes a readout circuit that converts the pixel current into image data. The readout circuit includes an analog-digital converter and, additionally, further includes a buffer for storing the image data. A pixel control signal is applied from outside the image sensor die 100 to control and select pixels arranged in the plurality of sub-light receiving regions 110 (for example, to reset the light receiving portion and/or a capacitor). On the other hand, an output control signal for controlling the readout circuit to output the image data is applied from outside the image sensor die 100. As another embodiment, the peripheral circuit 120 further includes a row driver for controlling and selecting the pixels. A driver control signal for controlling the row driver is applied from outside the image sensor die 100. As yet another embodiment, the peripheral circuit 120 further includes a time controller for driving the row driver. A time control signal for controlling the time controller is applied from outside the image sensor die 100.

The plurality of image sensor dies 100 are arranged on the substrate 100 to be spaced apart from each other by substantially the same distance $d_2$. The distance $d_1$ and the distance $d_2$ are formed to such a degree that no overlapping regions are formed between the plurality of detection sub-regions (110a' to 110d') or even if overlapping regions are formed, they are minimal. For example, the distance $d_2$ and the distance $d_1$ are substantially the same. An area of the substrate 100 and the number of image sensor dies 100 arranged thereon are determined by the large-area detection region to be realized. For example, when the ratio of the horizontal length $w_1$ of the first light receiving sub-region 110a to the horizontal length $w_2$ of the first detection sub-region 110a' is 1:10 and a ratio of the horizontal lengths $w_1$ to $d_1$ is 1:10, the large-area detection region with horizontal and longitudinal lengths $60*w_1$ is implemented by 9 image sensor dies 100 in a 3*3 arrangement. Assuming that the area of the image sensor with a single light-receiving area is 100%, the same large-area detection region can be ensured by the 9 image sensor dies 100 corresponding to about 25%.

The substrate 200 includes conductive wiring electrically connected to the plurality of image sensor dies 100, so as to transmit a control signal applied from the outside to the plurality of image sensor dies 100 and to output the image data generated by the image sensor dies 100 to the outside.

The substrate 200 is, for example, a low-priced semiconductor substrate, a PCB (printed circuit board), an FPCB (flexible printed circuit board), or the like. Silicon wafers for solar cells and the like are relatively inexpensive compared with silicon wafers for semiconductor substrates and image sensors, and are suitable for implementing the tiled image sensor 10. In particular, the conductive wiring is precisely formed on a semiconductor substrate by semiconductor processes such as photolithography and etching. As one embodiment, contact pads for the plurality of image sensor dies 100 are formed on the lower surfaces of the dies and are electrically connected to the substrate 200 by soldering or the like. As another embodiment, the contact pads for the plurality of image sensor dies 100 are formed on the upper surfaces of the dies and are electrically connected to the substrate 200 through wires or the like.

Figure 3:
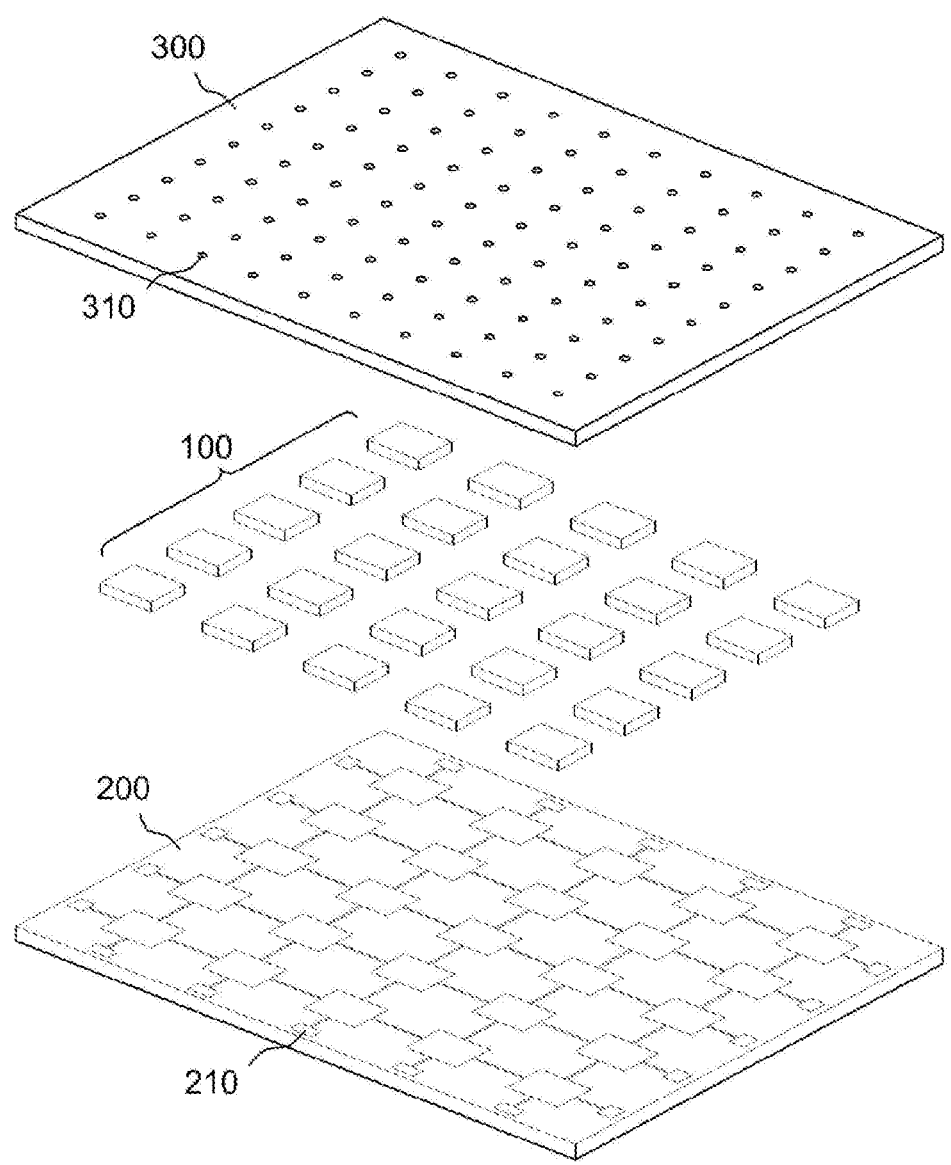
FIG. 3 is an exemplary exploded perspective view showing one embodiment of the tiled image sensor.

FIG. 3 is an exemplary exploded perspective view showing one embodiment of the tiled image sensor.

Referring to FIG. 3, the tiled image sensor 10 includes an optical lens layer 300 for restricting incident angles of light incident on a plurality of light receiving sub-regions that are respectively formed on a plurality of image sensor dies and a plurality of image sensors. The optical lens layer 300 is arranged above the image sensor dies 100 so that the reflected panel light 32 travels toward the light receiving sub-regions 110. The optical lens layer 300 includes light paths 310 through which the reflected panel light 32 passes. The light paths 310 are formed at positions corresponding to the light receiving sub-regions 110 of the image sensor dies 100. The optical lens layer 300 is separated from the image sensor dies 100 (FIG. 4 and FIG. 6) or bonded to the image sensor dies 100. The plurality of image sensor dies 100 are electrically coupled to the substrate 200. Bonding pads electrically connected to the contact pads of the image sensor dies 100 and conductive wiring 210 including wiring connected to the bonding pads are formed on the substrate 200.

Figure 4:
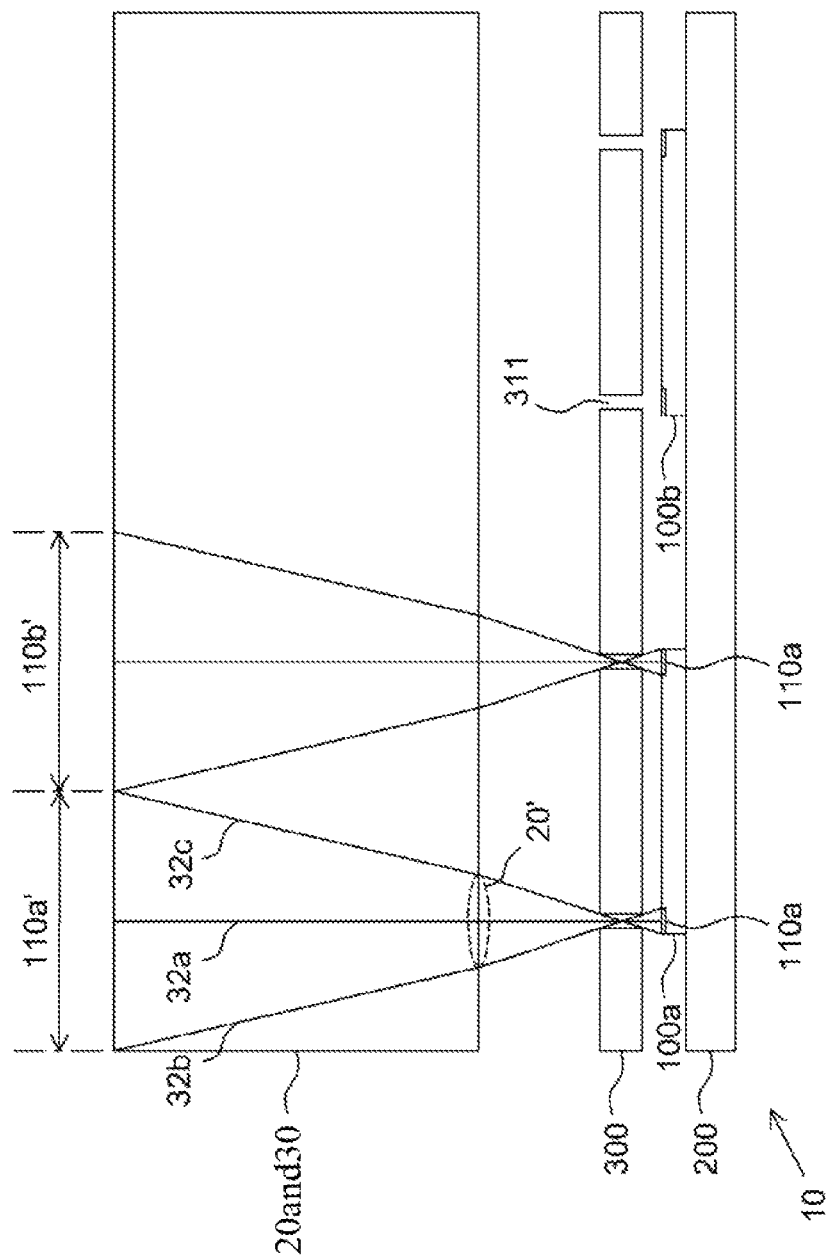
FIG. 4 is an exemplary cross-sectional view showing one embodiment of the tiled image sensor shown in FIG. 3.

FIG. 4 is an exemplary cross-sectional view showing one embodiment of the tiled image sensor shown in FIG. 3. In order to describe the structure of the optical lens layer 300, the portion A in FIG. 1 is illustrated in detail.

Referring to FIG. 4, the light paths provided through the optical lens layer 300 are pinholes 311. The optical lens layer 300 is formed by an optically opaque material, and the pinholes 311 are formed at positions corresponding to the light receiving sub-regions 110. The pinholes 311 penetrate the optical lens layer 300 from an upper surface to a lower surface of the optical lens layer 300, and the inside of the pinholes 311 are filled with air or a substance having a refractive index different from that of air.

The panel light 32a, 32b, 32c reflected from the first detection sub-region 110a' passes through a pinhole 311 to reach a light receiving sub-region 110. The lower surface of the display panel 20 serves as an interface with the air and refracts the reflected panel light 32a, 32b, 32c into different refraction angles dependent on the incident angles. Light within an effective incident angle range is refracted in an effective region 20' of the lower surface of the display panel 20, so as to pass through the pinhole 311. Conversely, light reflected in the first detection sub-region 110a' but traveling at angles beyond the effective incident angle range and light reflected in the second detection sub-region 110b' to reach the effective region 20' cannot pass through the corresponding pinhole 311. Specifically, the panel light 32a, which is reflected vertically downward at the center of the first detection sub-region 110a', reaches the center of the light receiving sub-region 110 or the pixels in the vicinity thereof.

The panel light 32b, which is reflected obliquely downward on the left side of the first detection sub-region 110a', is refracted in a counterclockwise direction on the lower surface of the display panel 20, and the refracted light passes through the pinhole 311 to reach the pixels on the right side of the light receiving sub-region 110. The panel light 32b, which is reflected obliquely downward on the right side of the first detection sub-region 110a', is refracted in a clockwise direction on the lower surface of the display panel 20, and the refracted light passes through the pinhole 311 to reach the pixels on the left side of the light receiving sub-region 110.

Figure 5:
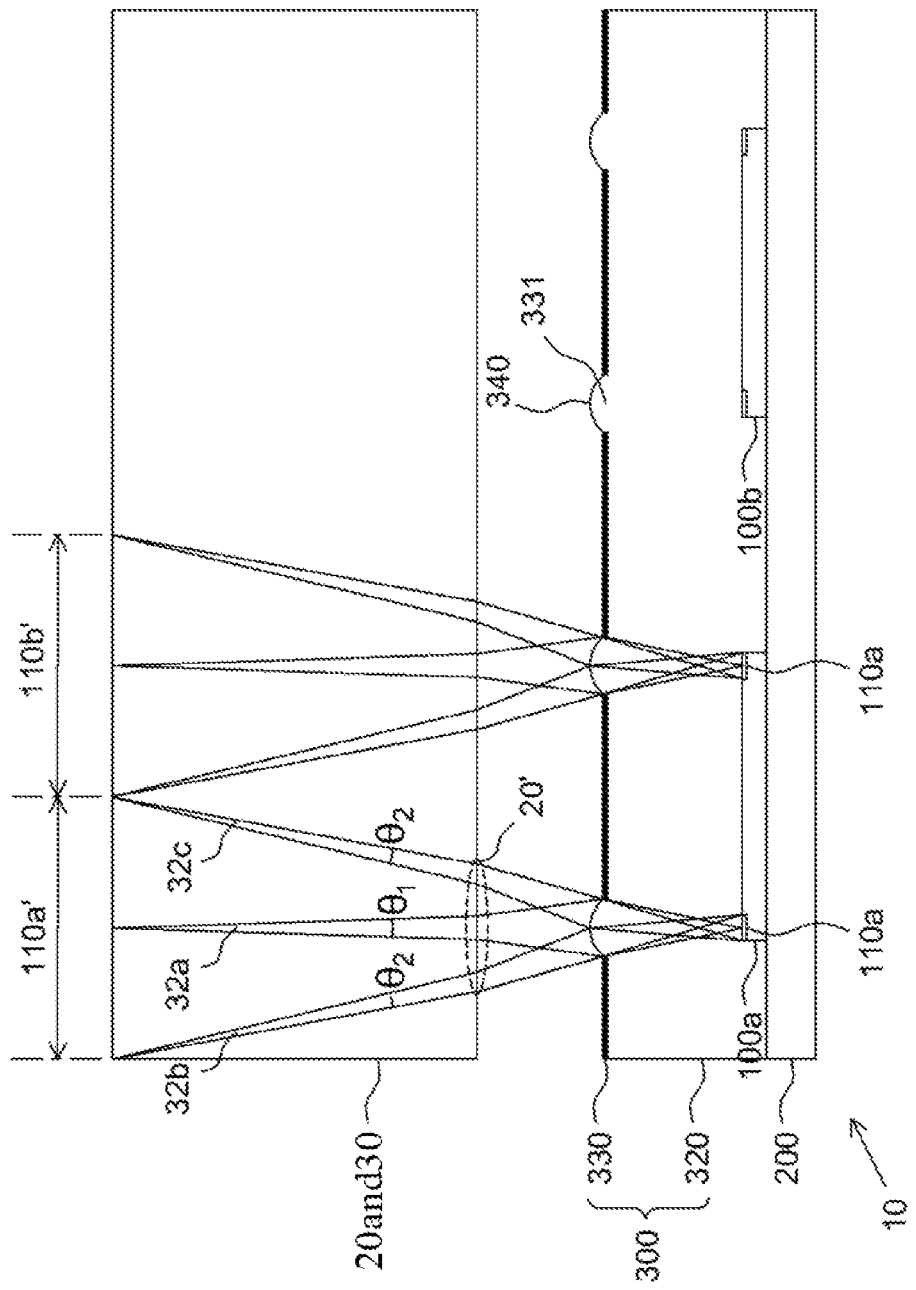
FIG. 5 is an exemplary cross-sectional view showing another embodiment of the tiled image sensor shown in FIG. 3.

FIG. 5 is an exemplary cross-sectional view showing another embodiment of the tiled image sensor shown in FIG. 3. In order to describe the structure of the optical lens layer 300, the portion A in FIG. 1 is illustrated in detail.

Referring to FIG. 5, the optical lens layer 300 includes an optically transparent light path layer 320, a light shielding layer 330 arranged above the light path layer 320 with openings 331 formed at positions corresponding to the light receiving sub-regions 110, and upper lenses 340 formed in the openings 331. Light paths are defined by the openings 331 and the upper lenses 340. The light path layer 320 is formed by laminating an optically transparent substance above the image sensor dies 100 and the substrate 200. A lens 340 concentrates the reflected panel light 32a, 32b, 32c that is within a certain angle range and departs from the same location on the first detection sub-region 110a'.

The panel light 32a, 32b, 32c reflected in the first detection sub-region 110a' are concentrated by the lens 340 to reach the light receiving sub-region 110. The lower surface of the display panel 20 serves as an interface with the air and refracts the reflected panel light 32a, 32b, 32c into different refraction angles dependent on the incident angles. Light within an effective incident angle range is refracted in the effective region 20' of the lower surface of the display panel 20, so as to pass through the upper lens 240. Conversely, light reflected in the first detection sub-region 110a' but traveling at angles beyond the effective incident angle range and light reflected in the second detection sub-region 110b' to reach the effective region 20' cannot pass through the corresponding upper lens 340. Specifically, light within a first angle range $\theta_1$ of the panel light 32a reflected downward from the center of the first detection sub-region 110a' is concentrated by the lens 340 so as to reach the center of the light receiving sub-region 110 or the pixels in the vicinity thereof. Light within a second angle range $\theta_2$ of the panel light 32b reflected obliquely downward from the left side of the first detection sub-region 110a' is refracted in the counterclockwise direction on the lower surface of the display panel 20 and is concentrated by the lens 340 so as to reach the pixels on the right side of the light receiving sub-region 110. Light within the second angle range $\theta_2$ of the panel light 32b reflected obliquely downward from the right side of the first detection sub-region 110a' is refracted in the clockwise direction from the lower surface of the display panel 20 and is concentrated by the lens 340 so as to reach the pixels on the left side of the light receiving sub-region 110.

Figure 6:
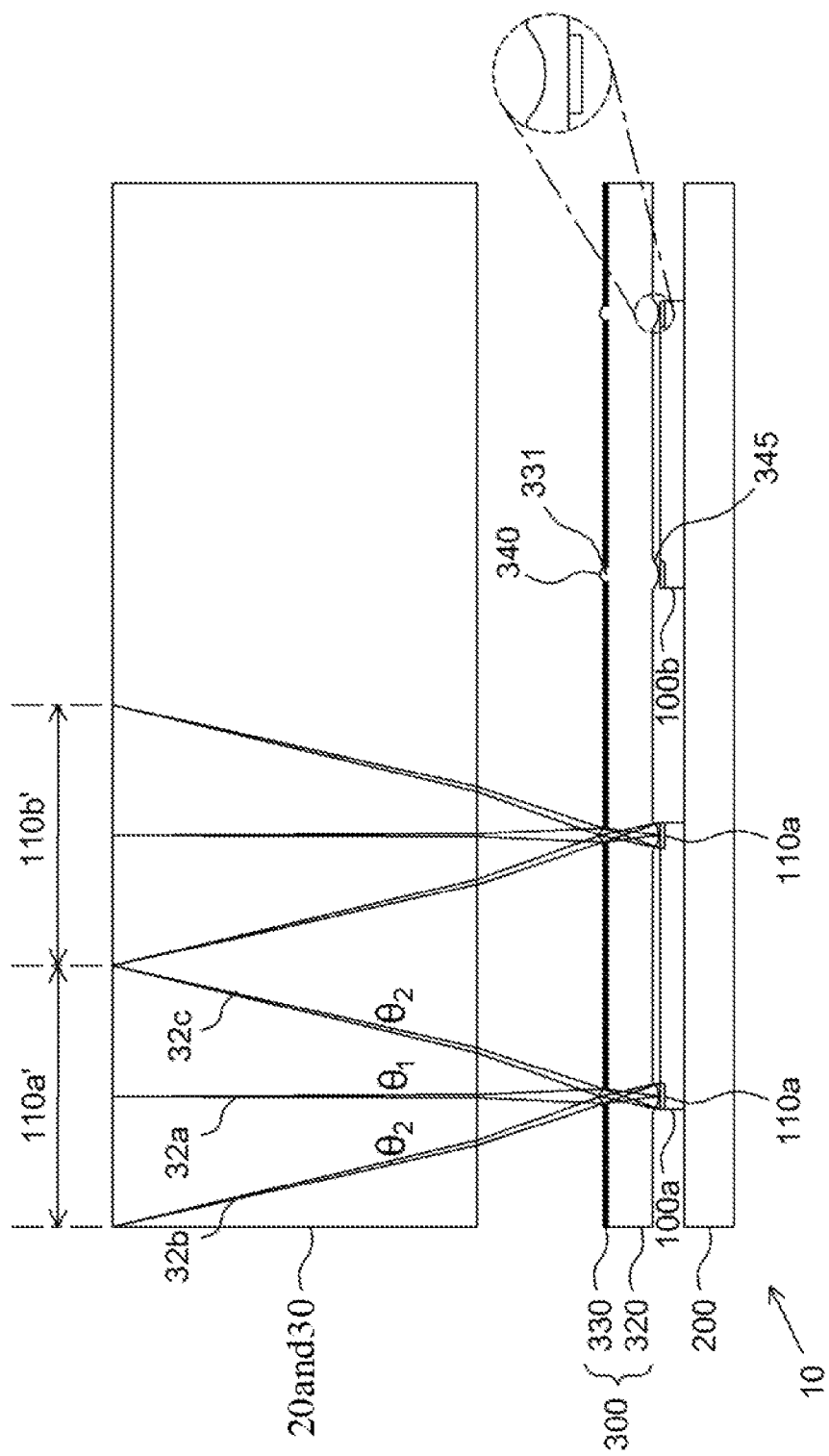
FIG. 6 is an exemplary cross-sectional view exemplarily showing yet another embodiment of the tiled image sensor shown in FIG. 3.

FIG. 6 is an exemplary cross-sectional view showing yet another embodiment of the tiled image sensor shown in FIG. 3. In order to describe the structure of the optical lens layer 300, the portion A in FIG. 1 is illustrated in detail.

Referring to FIG. 6, the optical lens layer 300 includes a light path layer 320, a light shielding layer 330 arranged above the light path layer 320 with openings 331 formed at positions corresponding to the light receiving sub-regions 110, upper lenses 340 formed in the openings 331, and lower lenses 345 formed corresponding to the upper lenses 340. Light paths are defined by the openings 331, the upper lenses 340, and the lower lenses 345. The upper lens 340 and the lower lens 345 concentrate the reflected panel light 32a, 32b, 32c that is within a certain angle range and departs from the same location on the first detection sub-region 110a'. By means of the combination of the upper lens 340 and the lower lens 345, the light path is shortened. As one embodiment, the light path layer 320 is formed of an optically transparent substance. The upper lenses 340 are optically bonded to the light path layer 320 through the openings 331, and the lower lenses 345 are optically bonded to the lower surface of the light path layer 320. As another embodiment, the upper lens 340 and the lower lens 345 are integrally formed.

The panel light 32a, 32b, 32c reflected in the first detection sub-region 110a' are concentrated by the upper lens 340 and the lower lens 345 so as to reach the light receiving sub-region 110. Light within a first angle range $\theta_1$ of the panel light 32a reflected downward from the center of the first detection sub-region 110a' is concentrated by the upper lens 340 and the lower lens 345, so as to reach the center of the light receiving sub-region 110 or the pixels in the vicinity thereof. Light within a second angle range $\theta_2$ of the panel light 32b reflected obliquely downward from the left side of the first detection sub-region 110a' is refracted in the counterclockwise direction on the lower surface of the display panel 20 and is concentrated by the upper lens 340 and the lower lens 345, so as to reach the pixels on the right side of the light receiving sub-region 110. Light within the second angle range $\theta_2$ of the panel light 32b reflected obliquely downward from the right side of the first detection sub-region 110a' is refracted in the clockwise direction from the lower surface of the display panel 20 and is concentrated by the upper lens 340 and the lower lens 345, so as to reach the pixels on the left side of the light receiving sub-region 110.

The lower lenses 345 are separated from the light receiving sub-regions 110. A medium with a different refractive index, such as air, is interposed between the lower lenses 345 and the light receiving sub-regions 110, and light emitted from the lower lenses 345 is refracted to reach the light receiving sub-regions 110. In order to separate the lower lenses 345 from the light receiving sub-regions 110, a partition (not shown) is placed between the lens layer 300 and the substrate 200.

Figure 7:
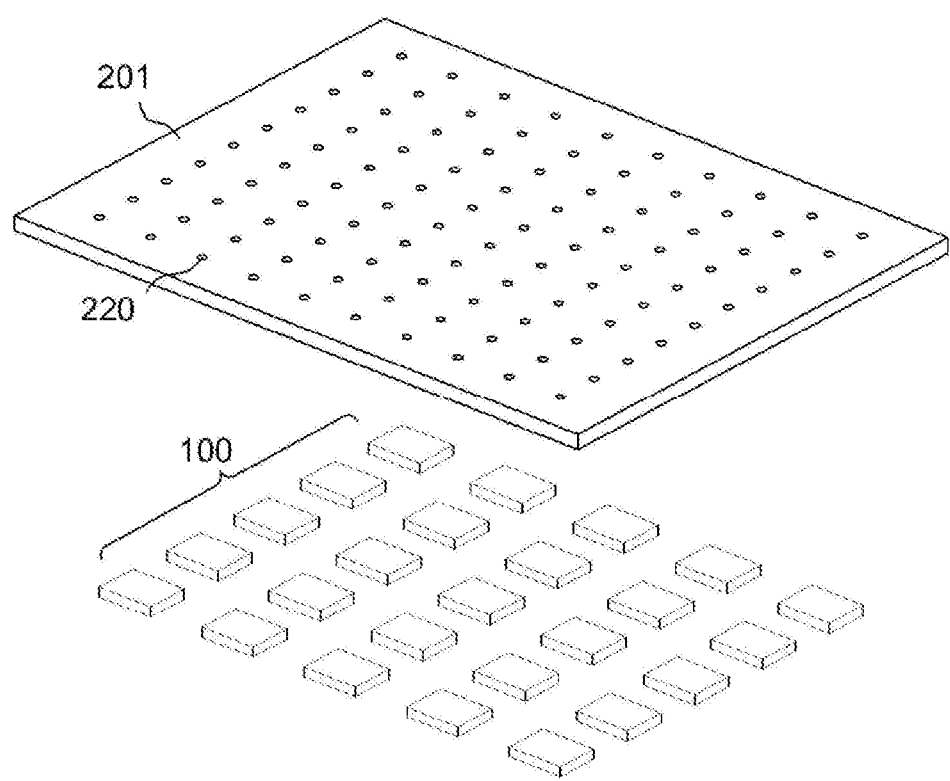
FIG. 7 is an exemplary exploded perspective view showing another embodiment of the tiled image sensor.

FIG. 7 is an exemplary exploded perspective view showing another embodiment of the tiled image sensor.

Referring to FIG. 7, the tiled image sensor 10 includes a substrate 201, which is used for restricting incident angles of light incident on a plurality of light receiving sub-regions respectively formed on a plurality of image sensor dies and a plurality of image sensors and is electrically coupled to the plurality of image sensor dies 100. Compared with the structures illustrated in FIG. 3 to FIG. 6, the substrate 200 and the optical sensor layer 300 are integrated so that the overall thickness of the tiled image sensor 10 can be reduced. Bonding pads electrically connected to the contact pads of the image sensor dies 100 and conductive wiring 210 including wiring connected to the bonding pads are formed on the lower surface of the substrate 200. The plurality of image sensor dies 100 are electrically coupled to the lower surface of the substrate 201. The substrate 201 is arranged above the image sensor dies 100 so that the reflected panel light 32 travels toward the light receiving sub-regions 110. The substrate 201 includes light paths 220 through which the reflected panel light 32 passes. The light paths 220 are formed at positions corresponding to the light receiving sub-regions 110 of the image sensor dies 100. The light paths 220 through which the reflected panel light 32 passes are formed by extending from an upper surface to a lower surface of the substrate 201. The light paths 220 have, for example, the structures illustrated in FIG. 4 to FIG. 6.

Figure 8:
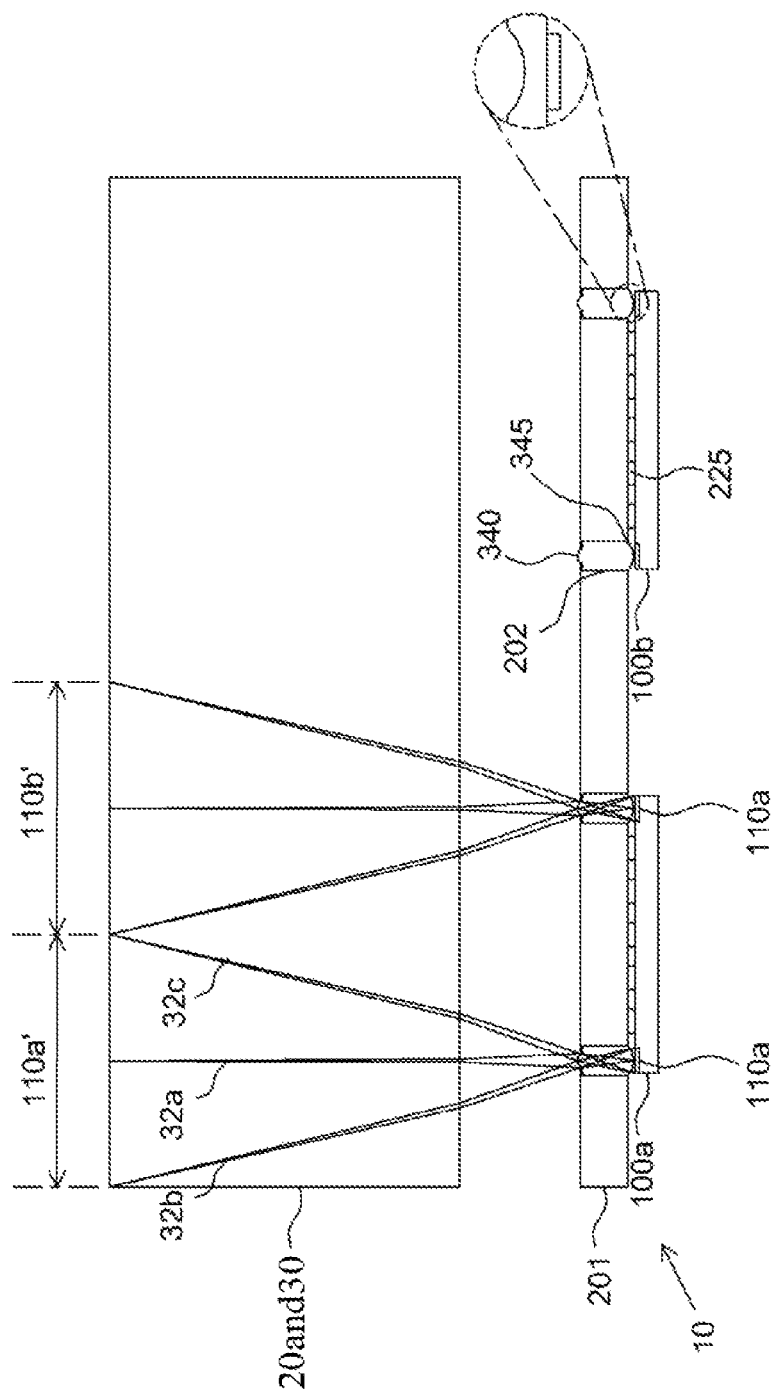
FIG. 8 is an exemplary cross-sectional view exemplarily showing another embodiment of the tiled image sensor shown in FIG. 7.

FIG. 8 is an exemplary cross-sectional view showing one embodiment of the tiled image sensor shown in FIG. 7. In order to illustrate the structure of the optical lens layer 300, the portion A in FIG. 1 is illustrated in detail.

Referring to FIG. 8, the substrate 201 includes through holes 202 formed at positions corresponding to the light receiving sub-regions 110, upper lenses 340 located in the through holes 202, and lower lenses 345 formed corresponding to the upper lenses 340. Light paths are defined by the through holes 202, the upper lenses 340, and the lower lenses 345. The upper lens 340 and the lower lens 345 concentrate the reflected panel light 32a, 32b, 32c that is within a certain angle range and departs from the same location on the first detection sub-region 110a'. By means of the combination of the upper lens 340 and the lower lens 345, the light path is shortened. The substrate 201 is formed by an optically transparent or opaque substance. When the substrate 201 is formed by an optically transparent substance, the substrate 201 does not include the through holes 202, and a light shielding layer (not shown in the figure) including openings formed at positions corresponding to the upper lenses 340 are formed on the upper surface of the substrate 201. As one embodiment, when the substrate 201 is formed by an optically opaque substance, the upper lens 340 and the lower lens 345 are integrally formed. As another embodiment, when the substrate 201 is formed by an optically transparent substance, the upper lenses 340 are optically bonded to the substrate 201 through the openings formed in the light shielding layer, and the lower lenses 345 are optically bonded to the lower surface of the substrate 201.

The image sensor dies 100 are electrically coupled to the conductive wiring formed on the lower surface of the substrate 201. As one embodiment, contact pads are formed on the upper surfaces of the image sensor dies 100 and are electrically coupled to the conductive wiring of the substrate 201 by soldering 225 or the like. As another embodiment, the contact pads are formed on the lower surface of the image sensor die 100 and electrically coupled to the conductive wiring of the substrate 201 through wires.

The lower lenses 345 are separated from the light receiving sub-regions 110. As one embodiment, the lower lenses 345 are separated from the light receiving sub-regions 110 by soldering 225. As another embodiment, in order to separate the lower lenses 345 from the light receiving sub-regions 110, a partition (not shown) is placed between the substrate 201 and the image sensor dies 100.

Figure 9:
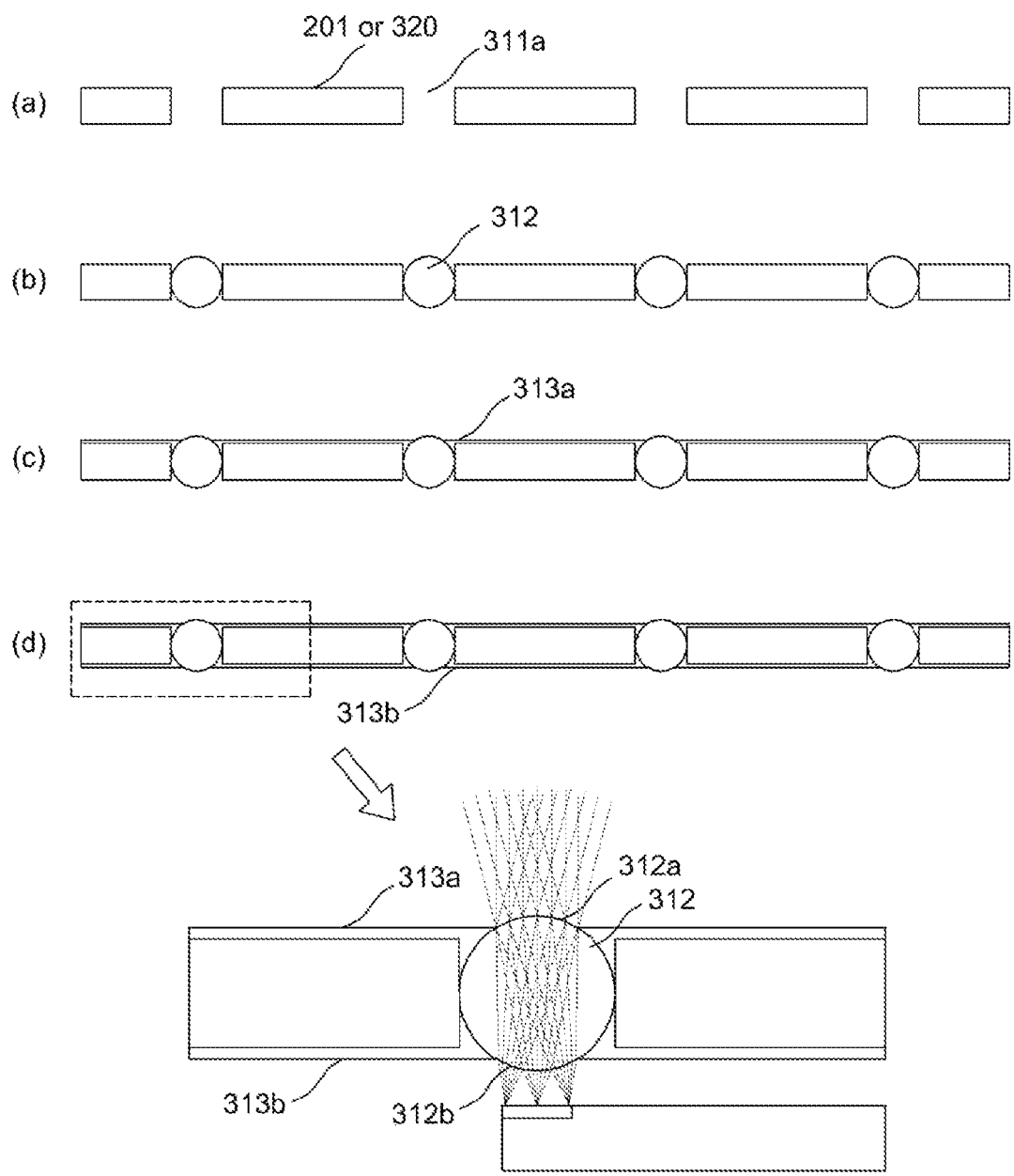
FIG. 9 is an exemplary diagram showing one embodiment in which an upper lens and a lower lens are implemented by using a ball lens.

FIG. 9 is an exemplary diagram showing one embodiment in which the upper lens and the lower lens are implemented by using a ball lens.

In FIG. 6 or FIG. 8, the upper lens 340 and the lower lens 345 have different radii of curvature in order to increase the incident amount of the reflected panel light and/or limit the incident angle of the reflected panel light. In contrast, an upper lens 312a and a lower lens 312b in FIG. 9 are implemented by a part of a curved surface of a ball lens 312 and therefore have substantially the same radius of curvature.

In part (a) of FIG. 9, through holes 311a are formed in the light path layer 320 or the substrate 201. The width of the through hole 311a is substantially the same as or greater than the diameter of the ball lens 312. The through holes 311a are formed at positions corresponding to the light receiving sub-regions 110. The light path layer 320 is an optically transparent or opaque film, and the substrate 201 is an optically transparent or opaque semiconductor substrate.

In part (b) of FIG. 9, ball lenses 312 are disposed inside the through holes 311a. In part (c) of FIG. 9, an upper light shielding layer 313a is formed on the upper surface of the light path layer 320 or the substrate 201. The upper light shielding layer 313a is formed so as to expose a part of an upper curved surface of the ball lens 312 disposed in the through hole 311a. The upper curved surface exposed through the upper light shielding layer 313a becomes the upper lens 312a. The upper light shielding layer 313a fills at least a part of the space between a side face of the ball lens 312 and an inner side face of the through hole 311a. Additionally, in part (d) of FIG. 9, a lower light shielding layer 313b is also formed on the lower surface of the light path layer 320 or the substrate 201. A lower curved surface exposed through the lower light shielding layer 313b becomes the lower lens 312b. Here, the width of the openings of the upper light shielding layer 313a that define the upper lenses 312a is different from the width of the openings of the lower light shielding layer 313b that define the lower lenses 312b.

Figure 10:
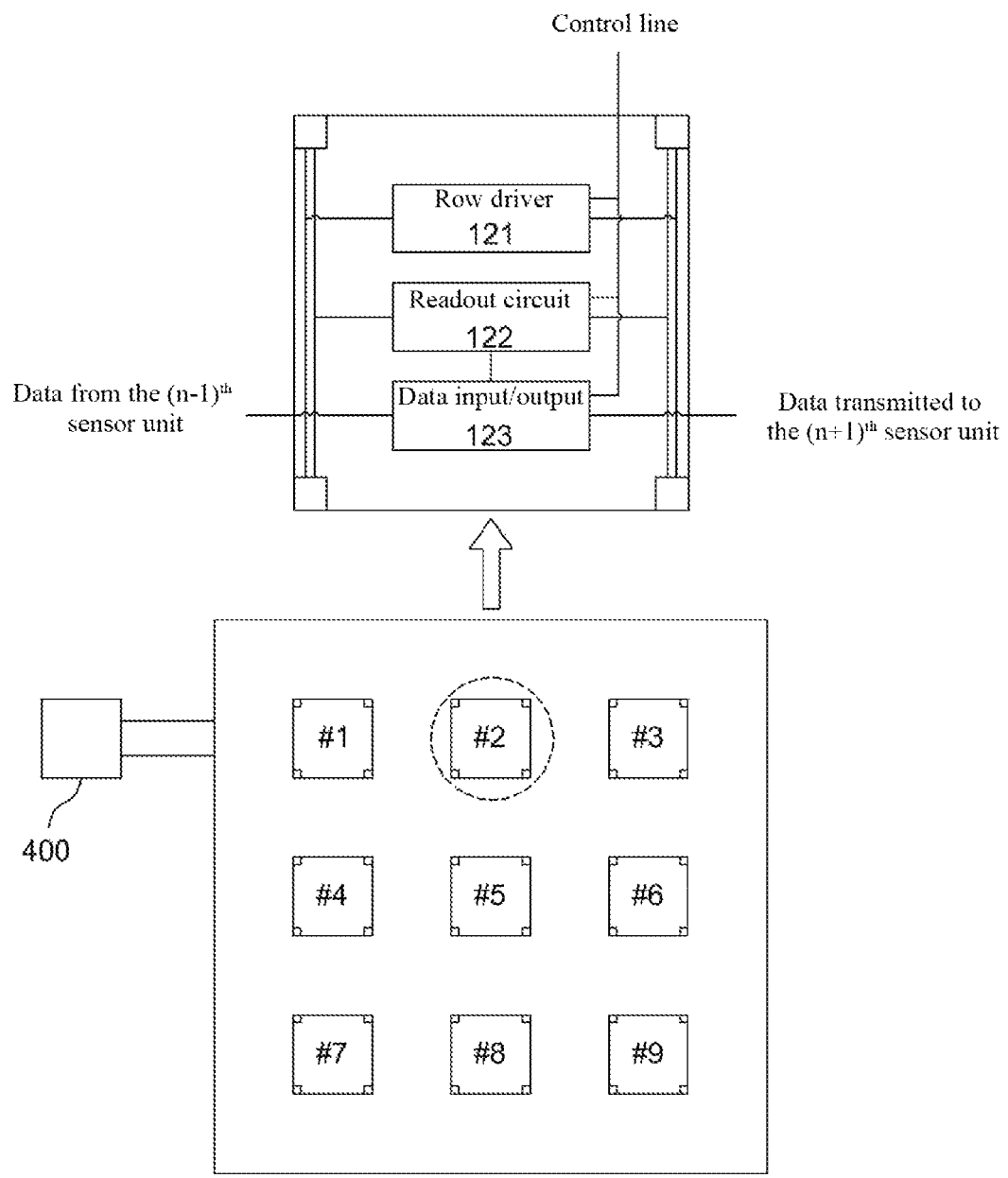
FIG. 10 is an exemplary diagram showing one embodiment of a functional configuration of an image sensor die.

FIG. 10 is an exemplary diagram showing one embodiment of a functional configuration of the image sensor die.

The image sensor die 100 is provided with a peripheral circuit 120 in a remaining region where the plurality of light receiving sub-regions 110 are not formed, that is, between the light receiving sub-regions 110 arranged at intervals. The image sensor die 100 includes a readout circuit (RO; 122) and a data output circuit 123. In the configuration illustrated in FIG. 10, a microcontroller 400 controls the actions of the plurality of image sensor dies 100. The microcontroller 400 controls the readout circuit 122 and the data output circuit 123 of the image sensor die 100 to output image data blocks. Here, the image data block is a set of image data generated by 2N*2M pixels that constitute a plurality of light receiving sub-regions 110 on one image sensor die 100. That is, the data output circuit 123 outputs the image data corresponding to 2N*2M pixels in block units. As one embodiment, the microcontroller 400 performs the function of a row driver that generates a pixel control signal for controlling and selecting pixels located in the light receiving sub-regions 110. As another embodiment, a row driver is additionally provided, which is electrically connected to the light receiving sub-regions 110 through a pixel control line. The row driver is controlled by the microcontroller 400 or a time controller.

The peripheral circuit 120 of the image sensor die 100 further includes a row driver. As one embodiment, the microcontroller 400 can perform the function of a time controller for controlling the row driver. As another embodiment, a time controller is additionally provided, which is electrically connected to the row driver through a pixel control line.

The microcontroller 400 is electrically connected to the readout circuit 122 and the data output circuit 123 of the image sensor die 100 through an output control line. The data output circuit 123 of the image sensor die 100 is electrically connected to a data line. The data output circuit 123 outputs the image data blocks through the data line according to an output control signal transmitted by the output control line. The data line can be formed in various ways. For example, each image sensor die 100 is provided with a data line or all or a part of the image sensor dies share a data line. That is, in a configuration in which all or a part of the image sensor dies share a data line, the data output circuit 123 outputs the image data blocks in a daisy chain manner. When all the image sensor dies share a data line, the microcontroller 400 controls to output the image data blocks in an order from the first image sensor die to the ninth image sensor die. When the first to third image sensor dies share a first data line, the fourth to sixth image sensor dies share a second data line, and the seventh to ninth image sensor dies share a third data line, the microcontroller 400 controls to output the image data blocks in an order of the first, fourth and seventh image sensor dies—the second, fifth and eighth image sensor dies—the third, sixth and ninth image sensor dies. For example, the microcontroller 400 controls the image sensor dies 100 to sequentially output the image data blocks at time intervals sufficient for one image sensor die 100 to output an image data block. As another embodiment, the image sensor die 100 that has completed the output of the image data block outputs a transmission completion signal, and the microcontroller 400 selects an image sensor die 100 that has not output a transmission completion signal to output the image data block.

The readout circuit 122 includes an analog-digital converter that converts the pixel current output from the pixels included in the first to fourth light receiving sub-regions 110 into image data and a buffer that stores the converted image data. The data output circuit 123 outputs the image data stored in the buffer in block units in parallel or in series according to the configuration of the data line.

Figure 11:
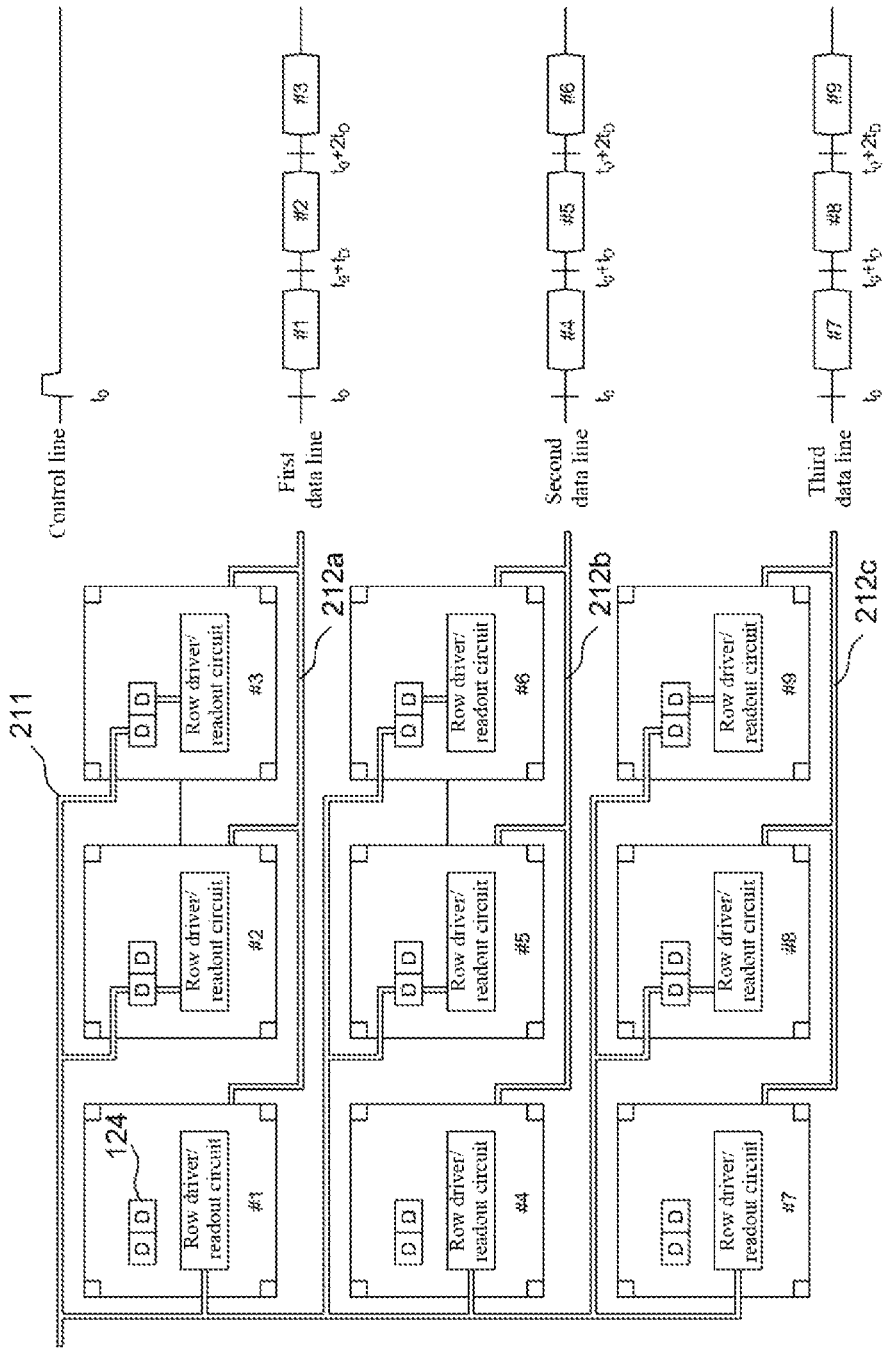
FIG. 11 is an exemplary diagram showing another embodiment of the functional configuration of the image sensor die.

FIG. 11 is an exemplary diagram showing another embodiment of the functional configuration of the image sensor die.

At least a part or all of the image sensor dies 100 among the plurality of image sensor dies 100 share data lines 212a, 212b, 212c and are operated by a control signal applied at a time to. The image sensor die 100 or the substrate 200, 201 includes at least one time delay element 124. The time delay element 124 delays the input control signal by a delay time $t_D$ before it is output. Here, the delay time $t_D$ is a time that is sufficient for the image sensor die 100 to scan the plurality of light receiving sub-regions to output the image data block. Depending on the positions where the image sensor dies 100 are disposed, different numbers of time delay elements or time delay elements with different delay times are electrically connected between a control line 211 and the peripheral circuit 120. For example, in the case of the first, fourth, and seventh image sensor dies, the control line 211 is directly connected to the peripheral circuit 120. In the case of the second, fifth, and eighth image sensor dies, the control line is connected to the peripheral circuit 120 through a time delay element. In the case of the third, sixth, and ninth image sensor dies, the control line 211 is connected to the peripheral circuit 120 through two time delay elements.

The above-mentioned description of the present invention is only illustrative, and those skilled in the art can make modifications in other specific forms without changing the technical concept or essential features of the present invention. Therefore, the above-mentioned embodiments are merely illustrative in all aspects, and the present invention is not limited thereto.

Compared with the above detailed descriptions, the scope of the present invention is more defined by the claims presented below, and the forms of all changes or modifications derived from the meaning and scope of the claims and equivalent concepts thereof are all included in the scope of the present invention.

The invention claimed is:

1. A tiled image sensor having a large-area detection region, the tiled image sensor comprising:
 a substrate on which conductive wiring is formed; and
 a plurality of image sensor dies arranged on the substrate to be spaced apart from each other by a first distance and electrically connected to the conductive wiring,
 wherein the image sensor die comprises:
  a plurality of light receiving sub-regions formed to be spaced apart from each other by a second distance;
  a peripheral circuit that is formed between the plurality of light receiving sub-regions, converts pixel current generated for each pixel included in the plurality of light receiving sub-regions into image data, and outputs the image data in block units; and
  a contact pad formed on a surface of the image sensor die to electrically connect the image sensor die to the substrate.

2. The tiled image sensor according to claim 1, wherein,
 the plurality of light receiving sub-regions are respectively arranged at corners of a light incident surface of the image sensor die, and
 the first distance and the second distance are the same.

3. The tiled image sensor according to claim 1, wherein, the plurality of light receiving sub-regions are N*M pixel arrays.

4. The tiled image sensor according to claim 1, further comprising:
 an optical lens layer arranged above the plurality of image sensor dies with light paths formed at positions corresponding to the plurality of light receiving sub-regions, wherein,
 lower surfaces of the plurality of image sensor dies opposite to the light incident surfaces are bonded to the substrate, and
 the conductive wiring is formed on an upper surface of the substrate.

5. The tiled image sensor according to claim 4, wherein,
 the optical lens layer is formed by an optically opaque material, and
 the light paths are pinholes extending from an upper surface to a lower surface of the optical lens layer.

6. The tiled image sensor according to claim 4, wherein, the optical lens layer comprises:
 an optically transparent light path layer;
 a light shielding layer arranged above the light path layer with openings formed at positions corresponding to the light receiving sub-regions; and
 upper lenses formed in the openings, and
 the light paths are defined by the openings and the upper lenses.

7. The tiled image sensor according to claim 4, wherein, the optical lens layer comprises:
 an optically transparent light path layer;
 a light shielding layer arranged above the light path layer with openings formed at positions corresponding to the light receiving sub-regions;
 upper lenses formed in the openings; and
 lower lenses formed corresponding to the upper lenses.

8. The tiled image sensor according to claim 1, wherein,
 the substrate comprises light paths formed at positions corresponding to the plurality of light receiving sub-regions,
 light incident surfaces of the plurality of image sensor dies are bonded to the substrate, and
 the conductive wiring is formed on a lower surface of the substrate.

9. The tiled image sensor according to claim 1, wherein, the peripheral circuit comprises:
 a readout circuit that converts the pixel current generated for each pixel included in the plurality of light receiving sub-regions into the image data; and
 a data output circuit that outputs the image data in block units in sequence through a data line formed by the conductive wiring.

10. The tiled image sensor according to claim 9, wherein, the peripheral circuit further comprises:
 a row driver that selects pixels for outputting the pixel current from the plurality of light receiving sub-regions.

11. The tiled image sensor according to claim 9, wherein, a part or all of the plurality of image sensor dies share the data line.

12. The tiled image sensor according to claim 11, wherein, the plurality of image sensor dies are operated by a control signal applied through a control line formed by the conductive wiring.

* * * * *